(12) United States Patent
Polovick et al.

(10) Patent No.: US 10,037,393 B1
(45) Date of Patent: Jul. 31, 2018

(54) CONSUMER PERFORMANCE INDEX SCORING FOR WEBSITES AND WEB-BASED APPLICATIONS

(71) Applicant: SOASTA, Inc., Mountain View, CA (US)

(72) Inventors: Benjamin D. Polovick, Temecula, CA (US); Vernon Archie Brewer, III, Redwood City, CA (US)

(73) Assignee: Akamai Technologies, Inc., Cambridge, MA (US)

( * ) Notice: Subject to any disclaimer, the term of this patent is extended or adjusted under 35 U.S.C. 154(b) by 281 days.

(21) Appl. No.: 15/145,036

(22) Filed: May 3, 2016

(51) Int. Cl.
*G06F 17/50* (2006.01)
*G06F 17/18* (2006.01)

(52) U.S. Cl.
CPC .......... *G06F 17/5009* (2013.01); *G06F 17/18* (2013.01); *G06F 17/50* (2013.01); *G06F 2217/10* (2013.01); *G06F 2217/16* (2013.01)

(58) Field of Classification Search
CPC ...................................................... G06F 17/50
USPC ............................................................ 703/1
See application file for complete search history.

(56) References Cited

U.S. PATENT DOCUMENTS

| | | | |
|---|---|---|---|
| 5,615,347 A | 3/1997 | Davis et al. | |
| 6,092,043 A | 7/2000 | Squires et al. | |
| 6,134,582 A | 10/2000 | Kennedy | |
| 6,317,786 B1 | 11/2001 | Yamane et al. | |
| 6,477,483 B1 | 11/2002 | Scarlat et al. | |
| 6,542,163 B2 | 4/2003 | Gorbet et al. | |
| 6,560,564 B2 | 5/2003 | Scarlat et al. | |
| 6,738,933 B2 | 5/2004 | Fraenkel et al. | |
| 6,792,393 B1 | 9/2004 | Farel et al. | |
| 6,817,010 B2 | 11/2004 | Aizenbud-Reshef et al. | |
| 6,898,556 B2 | 5/2005 | Smocha et al. | |
| 7,133,805 B1 | 11/2006 | Dankenbring et al. | |
| 7,334,162 B1 | 2/2008 | Vakrat et al. | |
| 7,548,875 B2 | 6/2009 | Mikkelsen et al. | |
| 7,587,638 B2 | 9/2009 | Shah et al. | |
| 7,607,169 B1 | 10/2009 | Njemanze et al. | |
| 7,617,201 B1 | 11/2009 | Bedell et al. | |
| 7,630,862 B2 | 12/2009 | Glas et al. | |

(Continued)

OTHER PUBLICATIONS

Edward W. Felten, Timing Attacks on Web Privacy, 2000.*

*Primary Examiner* — Lechi Truong
(74) *Attorney, Agent, or Firm* — The Law Offices of Bradley J. Bereznak

(57) ABSTRACT

A computer-implemented method creating a benchmark for consumer satisfaction of website or web application performance includes aggregating real user measurement (RUM) data captured from devices of users during sessions on a website or web application, the RUM data including a landing page load time of each user and whether a bounce occurred. The probability that each tenant will bounce is then modeled. Next, an ordered discrete set of lethal dose (LD) values is calculated and the tenants are then filtered for erroneousness. An ordered set of mean LD values is calculated, and that set is reduced to exactly $10^m$ ordered mean LD values. The $10^m$n ordered mean LD values are mapped to a corresponding number of ordered CPI scores ranging from 0 to 100, wherein the mapping results in the benchmark.

17 Claims, 7 Drawing Sheets

(56) References Cited

U.S. PATENT DOCUMENTS

| | | |
|---|---|---|
| 7,685,234 B2 | 3/2010 | Gottfried |
| 7,725,812 B1 | 5/2010 | Balkus et al. |
| 7,757,175 B2 | 7/2010 | Miller |
| 7,844,036 B2 | 11/2010 | Gardner et al. |
| 8,015,327 B1 | 9/2011 | Zahavi et al. |
| 8,166,458 B2 | 4/2012 | Li et al. |
| 8,306,195 B2 | 11/2012 | Gardner et al. |
| 8,341,462 B2 | 12/2012 | Broda et al. |
| 8,510,600 B2 | 8/2013 | Broda et al. |
| 9,015,654 B2 | 4/2015 | Kaasila et al. |
| 9,021,362 B2 | 4/2015 | Broda et al. |
| 9,154,611 B1 | 10/2015 | Jackson et al. |
| 9,229,842 B2 | 1/2016 | Broda et al. |
| 9,251,035 B1 | 2/2016 | Vazac et al. |
| 9,384,121 B2 | 7/2016 | Jackson et al. |
| 9,436,579 B2 | 9/2016 | Broda et al. |
| 9,450,834 B2 | 9/2016 | Gardner et al. |
| 9,491,248 B2 | 11/2016 | Broda et al. |
| 9,495,473 B2 | 11/2016 | Gardner et al. |
| 2002/0147937 A1 | 10/2002 | Wolf |
| 2003/0074161 A1 | 4/2003 | Smocha et al. |
| 2003/0109951 A1 | 6/2003 | Hsiung et al. |
| 2004/0039550 A1 | 2/2004 | Myers |
| 2004/0059544 A1 | 3/2004 | Smocha et al. |
| 2004/0123320 A1 | 6/2004 | Daily et al. |
| 2005/0216234 A1 | 9/2005 | Glas et al. |
| 2008/0066009 A1 | 3/2008 | Gardner et al. |
| 2008/0140347 A1 | 6/2008 | Ramsey et al. |
| 2011/0066892 A1 | 3/2011 | Gardner et al. |
| 2012/0017165 A1 | 1/2012 | Gardner et al. |
| 2012/0166634 A1 | 6/2012 | Baumback et al. |
| 2012/0246310 A1 | 9/2012 | Broda et al. |
| 2013/0097307 A1 | 4/2013 | Vazac et al. |
| 2013/0116976 A1 | 5/2013 | Kanemasa et al. |
| 2013/0205020 A1* | 8/2013 | Broda ................. G06F 11/3495 709/224 |
| 2014/0033055 A1 | 1/2014 | Gardner et al. |
| 2014/0180880 A1* | 6/2014 | Godsey ............. G06Q 30/0641 705/27.1 |
| 2014/0189320 A1 | 7/2014 | Kuo |
| 2014/0280880 A1 | 9/2014 | Tellis et al. |
| 2015/0067527 A1 | 3/2015 | Gardner et al. |
| 2015/0319071 A1 | 11/2015 | Kaasila et al. |

\* cited by examiner $$y(x) = \frac{1}{1 + e^{-(\beta_0 + \beta_1 x)}} \qquad \leftarrow 41$$

$$y_i(x) = \frac{1}{1 + e^{-(\beta_{0,i} + \beta_{1,i} x)}} \qquad \leftarrow 42$$

$$W_i = \frac{\hat{\beta}_{1,i}}{se(\hat{\beta}_{1,i})} \qquad \leftarrow 43$$

where $\hat{\beta}_{1,i}$ is the estimated slope coefficient for the model $y_i(x)$, and $se(\hat{\beta}_{1,i})$ is the standard error of the estimated slope coefficient.

$$x = -\frac{\ln\frac{1}{p} - 1 + \beta_0}{\beta_1} \qquad \leftarrow 44$$

$$LD(p) = -\frac{\ln\left(\frac{1}{p} - 1\right) + \beta_0}{\beta_1} \qquad \leftarrow 45$$

FIG. 4A $$L = \{LD15.00, LD15.01, LD15.02, ...LD40.00\}$$
$$\cup \{LD40.02, LD40.04, LD40.06, ...LD60.00\}$$
$$\cup \{LD60.05, LD65.10, LD65.15, ...LD85.00\}$$

← 46

$$\hat{L} = \{\widehat{LD_i15.00}, \widehat{LD_i15.01}, \widehat{LD_i15.02}, ...\widehat{LD_i40.00}\}$$
$$\cup \{\widehat{LD_i40.02}, \widehat{LD_i40.04}, \widehat{LD_i40.06}, ...\widehat{LD_i60.00}\}$$
$$\cup \{\widehat{LD_i60.05}, \widehat{LD_i65.10}, \widehat{LD_i65.15}, ...\widehat{LD_i85.00}\}$$

← 47

$$\overline{LDX} = \frac{1}{m}\sum_{i=1}^{m} \widehat{LD_i X}$$

← 48

$$\overline{L} = \underbrace{\{\overline{LD15.00}, \overline{LD15.01}, \overline{LD15.02}, ...\overline{LD40.00}\}}_{\text{2500 Distinct Values}}$$

← 49

$$\cup \underbrace{\{\overline{LD40.02}, \overline{LD40.04}, \overline{LD40.06}, ...\overline{LD60.00}\}}_{\text{1000 Distinct Values}}$$

$$\cup \underbrace{\{\overline{LD60.05}, \overline{LD60.10}, \overline{LD60.15}, ...\overline{LD85.00}\}}_{\text{500 Distinct Values}}$$

$$\overline{L}_{reduced} = \{\overline{LD}_{min}, ..., \overline{LD}_{max}\} \cap \overline{L}$$

← 50

FIG. 4B

CONSUMER PERFORMANCE INDEX SCORING FOR WEBSITES AND WEB-BASED APPLICATIONS

TECHNICAL FIELD

The present disclosure relates generally to the fields of cloud computing; more particularly, to systems and methods for capturing and analyzing real-time information of actual user experience on websites and using web-based applications, and using those results for creating a benchmark score of a particular website or web application as compared against others.

BACKGROUND

In the field of computing, a benchmark is the act of running a computer program, a set of programs, or other operations, in order to assess the relative performance of an object, as against other similar objects. For example, benchmarking has commonly been associated with assessing performance characteristics of computer hardware, for example, the floating point operation performance of a central processing unit (CPU). In the field of cloud computing, businesses and enterprises are interested in how the performance of their websites and web-based applications compares against others. Of particular interest is how their website or web application performs in terms of user engagement.

User engagement may be correlated to web performance by comparing landing page or home page load time performance against a performance metric known as the "bounce rate", which represents a ratio or percentage of visits to a website that only involve one web page (e.g., landing page), versus users who click on an actionable item or icon (e.g., to place an item in a shopping cart) or who actually view multiple web pages. For example, if in a given time period there are 100 visits to the website and 10 of those visitors immediately left without visiting another page, the bounce rate would be 10%. Since there is a strong correlation between the speed of a website (e.g., the time to load a webpage) and the probability of a user bouncing, analytics that gives businesses and developers insight into real user measurements (RUM) across all browsers and locations is very valuable.

Systems and methods for real-time capture of actual user experiences on a website, web application or mobile application are known in the art. For example, U.S. Pat. No. 9,021,362, which is herein incorporated by reference, teaches a system and method for visualized data analytics generated from the collection and consolidation of real-user measurements, as actual users are accessing a webpage or web application. In addition, various companies offer websites performance benchmarks by industry and geography. For instance, site24x7.com provides website performance benchmarks that list the average response times and availability of the top twenty global websites covering various business segments.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

FIGS. 4A-4B illustrates a set of mathematical expressions utilized in an example implementation of the processes shown in FIGS. 2 & 3.

DETAILED DESCRIPTION

Figure 1:
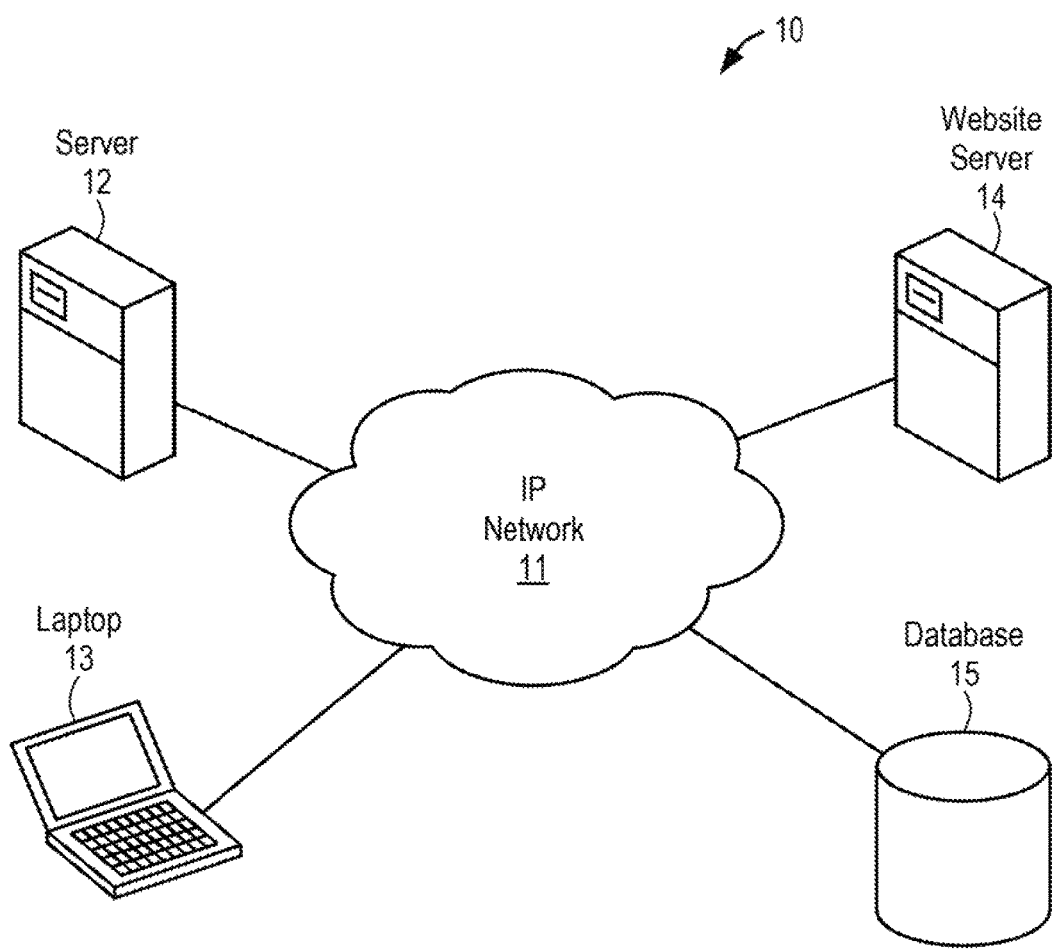
FIG. 1 is an example high level architectural diagram of a cloud computing platform for calculating a consumer performance index score (CPI score).

In the following description specific details are set forth, such as data analysis platforms, method steps, algorithms, test statistics, model types, etc., in order to provide a thorough understanding of the subject matter disclosed herein. However, persons having ordinary skill in the relevant arts will appreciate that these specific details may not be needed to practice the present invention. It should also be understood that the elements in the FIGS. are representational, and are not drawn to scale in the interest of clarity.

References throughout this description to "one embodiment", "an embodiment", "one example" or "an example" means that a particular feature, structure or characteristic described in connection with the embodiment or example is included in at least one embodiment. The phrases "in one embodiment", "in an embodiment", "one example" or "an example" in various places throughout this description are not necessarily all referring to the same embodiment or example. Furthermore, the particular features, structures or characteristics may be combined in any suitable combinations and/or sub-combinations in one or more embodiments or examples.

In the context of the present application, the term "cloud" broadly refers to a collection of machine instances, storage and/or network devices that work together in concert. The term "cloud computing" refers to a paradigm in which machine, storage, and application resources exist on a "cloud" of servers. In cloud computing shared resources, software and information are provided on-demand, like a public utility, via the Internet. Thus, cloud computing provides computation, data access, and storage resources without requiring users to know the location and other physical details of the computing infrastructure. Cloud computing is closely related to grid computing, which refers to the concept of interconnecting networked computers such that processing power, memory and data storage are all community resources that authorized users can utilize for specific tasks.

The term "server" broadly refers to any combination of hardware or software embodied in a computer (i.e., a machine instance) designed to provide services to client devices or processes. A server therefore can refer to a computer that runs a server operating system from computer-executable code stored in a memory, and which is provided to the user as a virtualized or non-virtualized machine; it can also refer to any software or dedicated hardware capable of providing computing services.

In the context of the present disclosure, a "mobile computing device" or "mobile device" (for short) refers to any one of a number of different portable electronic devices having a touch-sensitive display with a graphical user interface (GUI), one or more processors, memory and one or more modules, programs or sets of instructions for performing methods associated with the operations described herein. A mobile computing device typically runs on an operating system executed on one or more processors, and may also run one or more applications installed or resident in memory (e.g., firmware, RAM, EEPROM, etc.) In some embodiments, the mobile computing device may provide a plurality of functions including wireless communication, thereby allowing a user of the mobile device access data and information via connection to the Internet. Mobile computing devices include smartphones, tablet computers, wearable computers, ultra-mobile PCs, personal digital assistants, other hand-held devices, as well as other mobile computers (e.g., carputers) that have touch screen interfaces with wireless capabilities.

A mobile application, also known as mobile app, is a term used to describe a software or firmware program that runs on a mobile computing device.

The term "bounce rate" is a metric used in web traffic analysis that indicates the percentage of visitors/users that enter the website or web application and "bounce" (leave the site) after a certain amount of time or without viewing other pages on that site. A bounce, therefore, occurs when a user session ends after requesting the first page (i.e., landing page). The landing page is typically the homepage, and is commonly accessible by clicking on a hyperlink on another web page, by clicking on a search engine search result, or by inputting a HTTP address of a website to a browser application. A low bounce rate means that a page causes visitors to view more pages and continue deeper into the website. Bounce rate therefore is a measure of the effectiveness of a website in encouraging visitors to continue with their visit. It is expressed as a percentage and represents the proportion of visits that end on the first page of the website or application that the visitor sees.

The number of pages requested in a user session is defined as the session length. Additionally, a bounce may be defined as a session whose session length is equal to one.

A "load time" of a webpage is defined as the time (usually in milliseconds) from the start of the page navigation to the Page Onload event, i.e., when the webpage is considered ready.

In the context of the present disclosure, the term "beacon" refers to data related to a user's experience on a particular website, web application, or mobile application collected by a library running on the browser of a client device, and sent to a server (e.g., a collector server) via Hypertext Transfer (or Transport) Protocol (HTTP), or some other protocol. In the case of a mobile app, the data gathered may be based on definitions contained in a configuration file that is periodically downloaded to the mobile device running the mobile app. For example, every user who runs a particular mobile app on their mobile device may also automatically download a configuration file every few minutes that defines the various metrics and/or timers to be gathered and beaconed back to a server from the user's mobile device in real-time as the user runs or uses the mobile app. In the case of a website, the library may, in one embodiment, be a JavaScript library running on the browser of a client device.

The server receiving the beacon information may aggregate that data along with similar data received from other users accessing the same website, web application, or mobile application. Any HTTP headers sent by the browser as part of the HTTP protocol may also be considered part of the beacon. A beacon may therefore be thought of as a page view on a website or application, but without a corresponding page. For every user who visits that website, the browser running the library on the user's client device measures various metrics (e.g., webpage load time) and records data that is then sent or "beaconed" back to a results server in real-time as the user navigates through or uses the website or application.

An mPulse domain refers to a web domain of a client or customer of a data analysis platform or program that provides an analytic dashboard window with visual information from real user measurement (RUM) data captured, collected and aggregated by a server-based system. The RUM data is typically beaconed from a user's mobile device, or other computing device, to a results server that collects and aggregates the data. The results server, or another server, may also perform statistical analysis on the RUM data, e.g., calculate an average or median load time.

In the context of the present disclosure, the term "Median Lethal Dose" or "LD50" refers to the estimated average load time of the landing page that will yield a 50% bounce rate. In other words, if the average load time of the landing page were to either increase or decrease to equal LD50, then it is estimated that the bounce rate would either increase or decrease to 50%. The LD50, therefore, is a measure of how tolerant users are for a website: a higher LD50 value means that the users are more tolerant of a relatively longer load time of the site they are visiting.

In one embodiment, a cloud-based testing platform may be utilized to implement a consumer performance index (CPI) scoring methodology. That is, consumer satisfaction when accessing a particular website or web application may be quantified using a CPI score. In one embodiment, the beacons from the top 100 mPulse domains (by beacon count) are used as a benchmark for consumer satisfaction of website or web application performance. In other embodiments, more or fewer than 100 mPulse domains may be used. In one embodiment, the CPI score calculation factors in the relationship between a website's landing page load times and bounce rate.

In another embodiment, a methodology is provided to create CPI score benchmarks. The benchmarks may be created from a plurality of mPulse domains (e.g., top 100 domains) or from estimated RUM load times from the most recent archived load times.

FIG. 1 is an example high level architectural diagram of a system 10 that provides a web portal for a customer or consumer to use in order to score their website against other websites, particularly in terms of user engagement. In the embodiment shown, system 10 includes a server 12 connected via a cloud 11 with a laptop computer 13, a website server 14 and a database 15. Cloud 11 may comprise an Internet Protocol (IP) network, such as the general public Internet, or an intranet private computer network confined to an organization that uses IP technology or a combination of private and public networks. Although FIG. 1 shows the user of a laptop 13, it is appreciated that other embodiments may utilize any one of a number of different mobile computing devices (e.g., smartphones and/or tablets) or a desktop computer, workstation, or other computing device to communicate with server 12 via cloud 11. Similarly, server 12 shown in FIG. 1 may comprise a single server (as shown) or a plurality of servers, either located at a single center or distributed across different geographical locations.

In the embodiment shown, system 10, which comprises executable program for capture and analysis of RUM data, is deployed on server 12. For instance, server 12 may communicate with laptop 13 via a browser application running on laptop 13. In one implementation, a program running on server 12 operates to create a graphical user interface (GUI) that allows a user of laptop 13 to remotely interact with the program. In this way, a user of laptop computer 13 may orchestrate the capture and analysis of RUM data collected. In one embodiment historical RUM data may be archived in database 15. In other embodiments, RUM data is stored in a memory of server 12. In a particular implementation, the RUM data is mPulse data collected from real users who have, or are, accessing website server 14. The mPulse data may be stored in database 15. In other embodiments, database 15 is provided by a third party and stores most recent archived page load time data of a particular website or web application.

Via laptop 13 a user may also initiate the execution of a program that calculates a CPI score for the user's own website, shown in FIG. 1 running on website server 14. In other words, any user may access server 12 to obtain a CPI score assigned to a particular website or web application. The CPI score utilizes a statistical model that correlates web performance (i.e., landing page or homepage performance) with user engagement (i.e., user bounce rates).

Persons of skill in the art will understand that the software which implements the cloud-based testing platform may also be downloaded to the user's laptop computer 13 or implemented on a separate hardware appliance unit located either at the user's premises (e.g., behind the firewall) or anywhere in cloud 11. It is further appreciated that laptop 13 is representative of a wide variety of computer devices, such as workstations, personal computers, distributed computer systems, etc., that may be utilized by the user to execute the methods, processes, and steps described herein.

Figure 2:
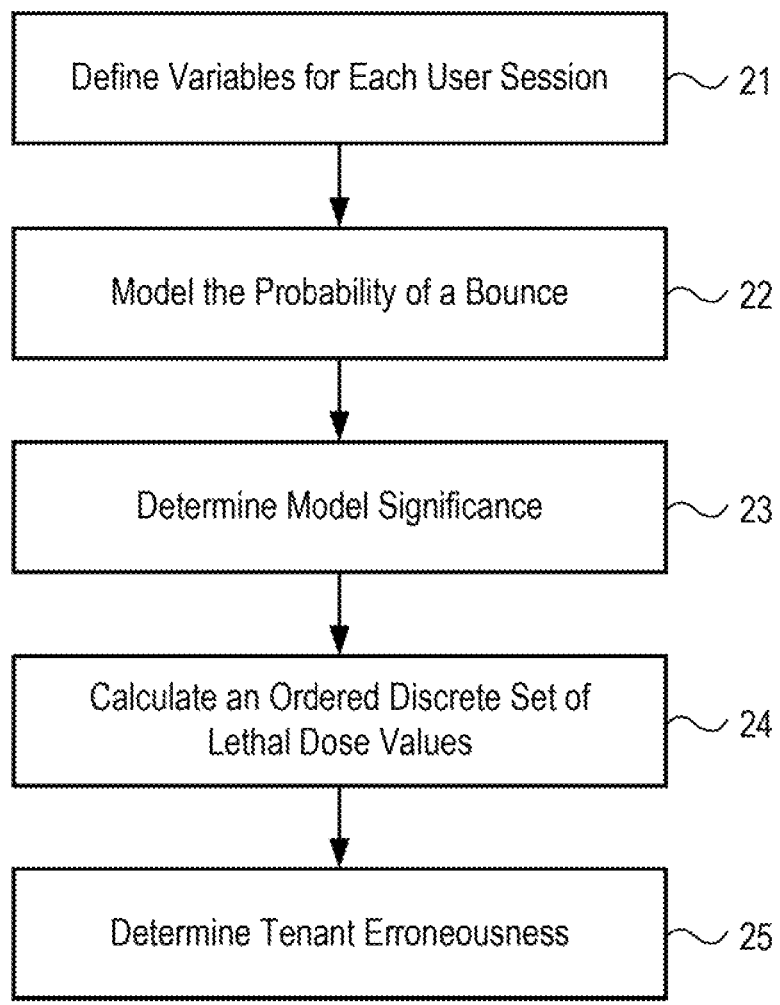
FIG. 2 is an example flow diagram of a process applied independently to each of a plurality of customers or tenants of an mPulse™ data analysis system that delivers performance metric information from real user measurement (RUM) data captured, collected and aggregated.

FIG. 2 is an example flow diagram of a process that may be applied independently to each of a plurality of customers or tenants of an mPulse™ data analysis system that delivers performance metric information from real user measurement (RUM) data captured, collected and aggregated. The process begins with the definition of variables for each user session. (Block 21) In one embodiment, the probability of a user bouncing is estimated, given the load time of the landing page. Thus, if the variable x is defined as the load time of the landing page, then the variable y may be defined to be equal to zero (y=0) if the user session does not bounce, and equal to one (y=1) if the session bounces. Person of skill in the art will understand that the variable y is a Bernoulli random variable, meaning that it can take only one of two possible values. Once the variables x and y are defined, the RUM data for each mPulse tenant may be aggregated. For example, for a given value of x (equal to the page load time of a session's landing page), the value of y is either 1 or 0, depending on whether the session bounced or not.

Continuing with the example of FIG. 2, the next step in the process is to model the probability of a bounce. (Block 22) In one embodiment, a logistic regression model, which is a special case of a generalized linear model, is used to model the probability of a bounce. This model may take the form shown as equation 41 of FIG. 4A, where $\beta_0$ and $\beta_1$ are constants that are estimated using the method of Maximum Likelihood Estimation (MLE). The model, e.g., y (x), may be effectively interpreted as the probability that a user will bounce, given the load time of the landing page x. That being the case, then the probability that the user session will not bounce is given as g(x)=1−y(x). Note that both y (x) and g (x) represent probabilities and each have a range, or set of possible values, of (0, 1).

In one embodiment, the benchmark beacon data is partitioned by mPulse API key. (Note that some website domains can have multiple API keys.) In one example, the beacon set is assumed to come from 100 or more distinct mPulse keys, each key representing a tenant in mPulse, or other RUM data capture l collection system. The set of keys may be defined as $K=f\{k_1, k_2, k_3, \ldots, k_n\}$, k>100. Then, for each $k_i$, $1 \le i \le n$ (n≥100) in the beacon set, the parameters $\beta_{0,i}$ and $\beta_{1,i}$ can be estimated in the logistic regression model shown as equation 42 of FIG. 4A, where $y_i$ (x) is the bounce probability for the $i^{th}$ mPulse key, given average landing page load time x; $\beta_{0,i}$ is the intercept coefficient of the logistic regression model for the $i^{th}$ mPulse key; and $\beta_{1,i}$ is the slope coefficient of the logistic regression model for the $i^{th}$ mPulse key.

Continuing with the process of FIG. 2, for each model $y_i$ (x) statistical significance is determined. (Block 23) In one embodiment statistical significance is determined using the Wald test statistic. Whenever a relationship within or between data items can be expressed as a statistical model with parameters to be estimated from a sample, the Wald test can be used to test the true value of the parameter based on the sample estimate. The Wald test statistic, $W_i$ is shown as equation 43 in FIG. 4A. Persons of skill will note that $W_i$ follows a standard normal distribution, and so the p-value is calculated accordingly. In one embodiment, if W is greater than 1.96 the logistic model for the tenant is flagged as significant. Conversely, if W is less than or equal to 1.96 the logistic model for the tenant is flagged as not significant.

In other embodiments, other tests such as the likelihood-ratio test and the Lagrange multiplier test may be used to determine statistical significance. Additionally, in another embodiment the determination of statistical significance may occur later in the process, e.g., as part of a determination of tenant erroneousness (discussed below).

For each mPulse tenant where the logistic model is determined to be significant, the process of FIG. 2 continues to the step of calculating an ordered discrete set of lethal dose (LD) values. (Block 24) To make a viable estimate of the average load time x at which the bounce rate would be p (0<p<1) the logistic regression model may be used, solving the following equation for x: y(x)=p, where y(x) is the model given by equation 41 in FIG. 4A. Solving this equation for x yields equation 44.

The Lethal Dose function, LD(p), which is the mean landing page load time that is expected to cause a bounce rate of p, is defined as shown in equation 45. The median Lethal Dose (LD50) can be derived by evaluating the lethal dose function at p=0.5 (LD50=LD(0.5)). Note that the lethal dose function is the inverse of the logistic function. Because the logistic function is monotone increasing, the lethal dose function is also monotone increasing (for any X>Y, LDX>LDY), and therefore a one-to-one function.

For each key, $k_i$, we can use the estimated bounce probability for the $i^{th}$ key, given average landing page load time x, to determine the lethal dose function $LD_i(p)$, which is the estimated average landing page load time, given a bounce rate of p. Once the model estimate $LD_i(p)$ is created for each key, a discrete range of LD values may be calculated at varying resolutions.

In one embodiment, extreme bounce rates are ignored, as it is assumed that the vast majority of websites experiences bounce rates in a range between 15% and 85%. As such the range of LD values calculated is limited to [LD15, LD85].

In one embodiment, three different resolutions are used across this range to calculate the set of LD values shown in equation 43 of FIG. 4B. Note that in the lowest range [LD15, LD40] the resolution is 1/100; in the middle range [LD40, LD60] the resolution is 1/50; and in the highest range [LD60, LD85] the resolution is 1/20. Smaller resolutions are used at the lower end because these LD values represent load times that are very small (milliseconds). The LD values at the higher end typically represent load times that are approaching one minute, or longer.

In another embodiment, only two different resolutions are used. Practitioners in the art will appreciated that a variety of different resolutions may be used according to how the distribution of CPI scores is intended to look. That is, using smaller resolutions reduces the range of LD values that can be mapped to CPI scores, thereby creating a more "spread out" distribution.

The range of LD values is calculated for each mPulse key, using the corresponding lethal dose model. As such the $i^{th}$ key will have the set of estimated LD values given in equation 47 of FIG. 4B, where $1 \leq i \leq n$ ($n \geq 100$).

The final step in the process shown in FIG. 2 is to determine tenant erroneousness. (Block 25). The idea here is to filter out the set of n mPulse keys that are under consideration. The number of keys is reduced from n to m ($m < n$) by using one or more different filters or checks. In one embodiment, three filters are used to determine erroneousness. First, a tenant is flagged as erroneous if the Wald statistic implies insignificance (showing a weak correlation between x and y). In other words, if the correlation between landing page load times and bounce rate is too weak, we drop that mPulse key. Secondly, if the logistic model implies a negative correlation between x and y, e.g., LD85<LD15, that key is dropped. Lastly, if the sample of sessions for a given mPulse key has a bounce rate less than 15% or greater than 85%, that key is dropped from the list of considered mPulse keys. This filter checks for a website that is well outside the norm. Tenants that pass through these filters are considered non-erroneous and usable for CPI benchmarking. The filtered set of mPulse keys is $K_{filtered} = \{k_1, k_2, k_3, \ldots, k_m\}$, where $m \leq n$.

Figure 3:
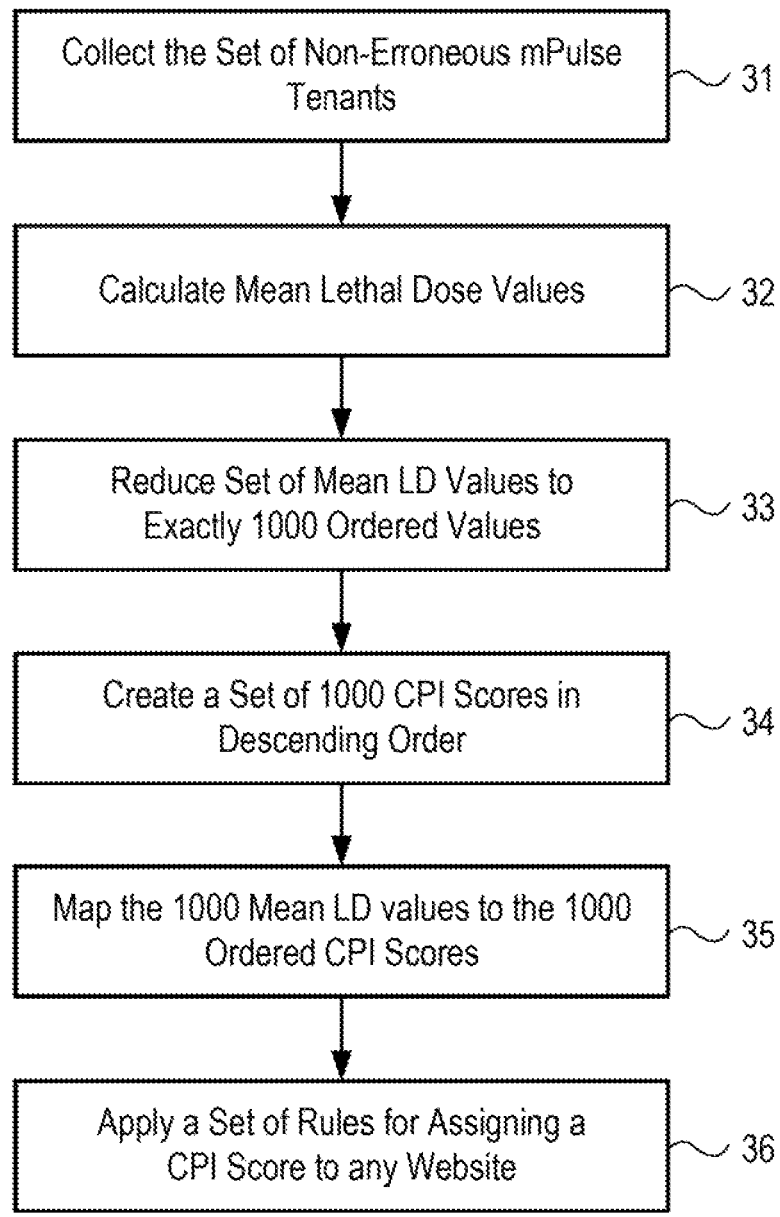
FIG. 3 is an example flow diagram of a process applied after logistic models have been created for each mPulse tenant.

FIG. 3 is an example flow diagram of a process applied after logistic models have been created for each mPulse tenant. The process begins with collecting the set of m non-erroneous mPulse tenants. (Block 31). These are the tenants that passed the filters applied in block 25 of the process shown in FIG. 2. Next, using the filtered set of mPulse keys $K_{filtered}$, we calculate the mean of each LD value across those m keys. (Block 32). That is, each LD value is averaged out across all non-erroneous tenants, with equal weights being given to each tenant. The mean of LDX is shown by equation 48 in FIG. 4B. The result is the set of 4,000 mean LD values shown in equation 49.

At block 33 of the example process shown in FIG. 3 the set of 4,000 mean LD values is reduced to exactly 1,000 ordered values. It is typically the case that no matter how low average landing page load times, it is not expected that, on average, bounce rate will fall below 35%. Furthermore, it is expected that most websites, on average, would have to experience extremely slow landing page performance in order to approach bounce rates close to 85%. Given these expectations, the reduction of the set of mean LD values from 4,000 to 1,000 may be accomplished, in one embodiment, as follows.

The first step is to determine the smallest non-negative mean LD value from the set of values shown in equation 49. This value is the first element in the reduced set, and is denoted mean $LD_{min}$. All negative LD values are then removed from the set. Starting with mean $LD_{min}$, the next 999 LD values are taken in ascending sequence (increasing order) from equation 49, with the $1,000^{th}$ LD value being denoted mean $LD_{max}$. The new set of reduced mean LD values is then the discrete set defined as shown in equation 50 of FIG. 4B. Note that mean $LD_{min}$ typically falls somewhere between mean LD35 and mean LD45, whereas mean $LD_{max}$ typically is somewhere between mean LD60 and mean LD75.

After the reduced set has been created in the example process shown in FIG. 3, the next step is to create a set of 1,000 CPI scores in descending order. (Block 34 in FIG. 4B) For the example shown, the list of 1,000 ordered CPI scores is $C = \{100.0, 99.9, 99.8, \ldots, 0.1\}$. Once the 1,000 distinct LD values of the reduced set are chosen, the next step is to map these load times to the list of 1,000 CPI scores. (Block 35 in FIG. 3) We start by ranking the LD values in descending order from 1,000 to 1 such that $LD_{min}$ has a rank of 1,000 and $LD_{max}$ has a rank of 1. For each load time in the reduced set of values a corresponding CPI score is assigned. For example, $LD_{min}$ is assigned the CPI score 100.0, and $LD_{max}$ is assigned the CPI score 0.1. In other words, a one-to-one mapping is created by assigning the $n^{th}$ element from the set of LD values to the $n^{th}$ element in the ordered list of CPI scores. This mapping step results in a CPI score benchmark.

Now, a CPI score can be assigned to any website or web application outside of the reduced set shown in equation 50. (Block 36 in FIG. 3) That is, for each load time l a CPI score can be determined by applying a simple set of rules. For instance, if load time l is greater than or equal to $LD_{max}$, then the CPI score is 0.0; if load time l is less than or equal to $LD_{min}$, then the CPI score is 100.0; and if load time l is greater than $LD_{min}$ and less than $LD_{max}$, then the CPI score is assigned according to the number in the order where load time l falls. Stated mathematically, in the case where $LD_{min} < l < LD_{max}$, and $l > (n-1)^{th}$ LD value AND $l \leq n^{th}$ LD value ($1 < n < 1,000$), then the CPI score is equal to the $n^{th}$ value from the set of ordered CPI scores. For example, if a website's mean load time l of a landing page happens to fall in the $950^{th}$ rank in the ordered list of LD values, then the CPI score assigned to that website is 95.0.

Figure 5:
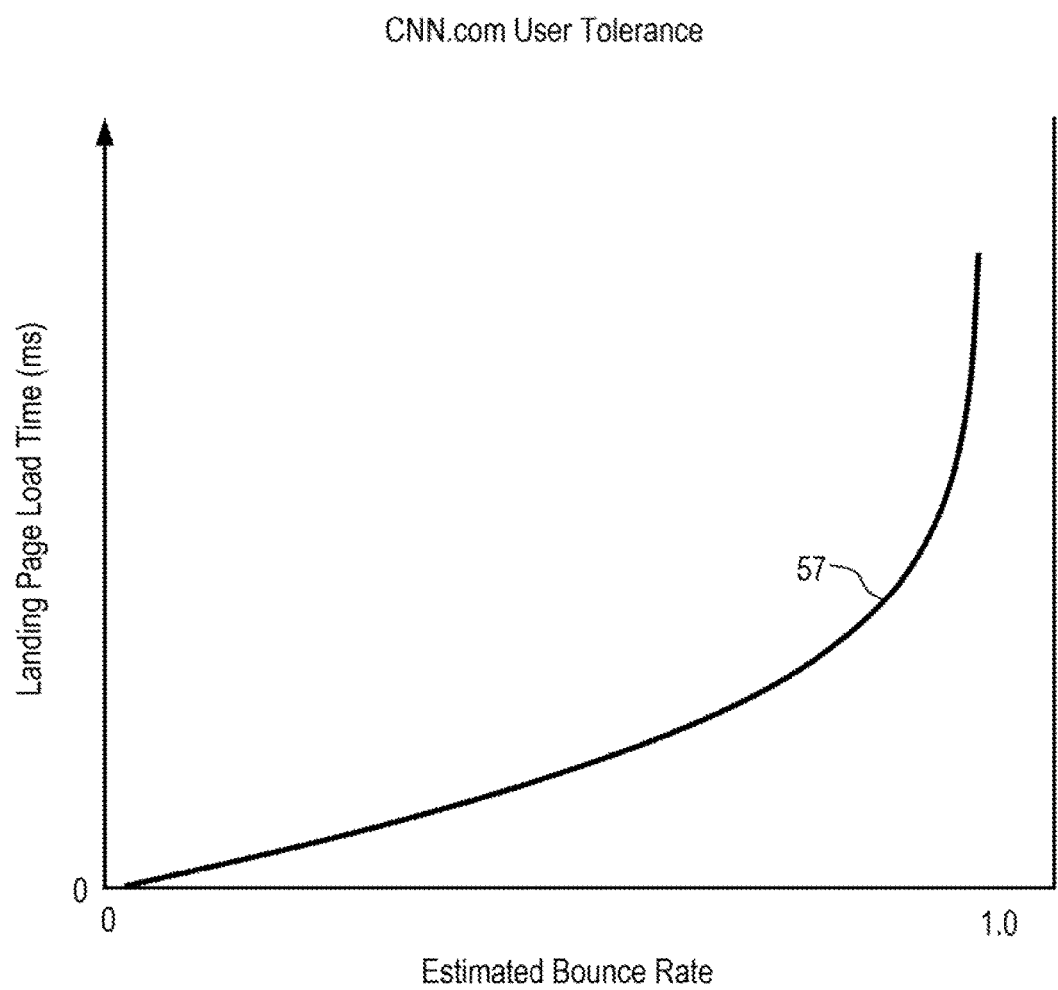
FIG. 5 illustrates an example graph of user tolerance showing a relationship between landing page load time and estimated bounce rate.

FIG. 5 illustrates an example graph of user tolerance showing how the logistic function can model the relationship between bounce rates (i.e., bounce probability) and page load time of the landing page. Note that line 57 is relatively linear in the lower landing page load time region, but increases sharply as load times get larger.

Figure 6:
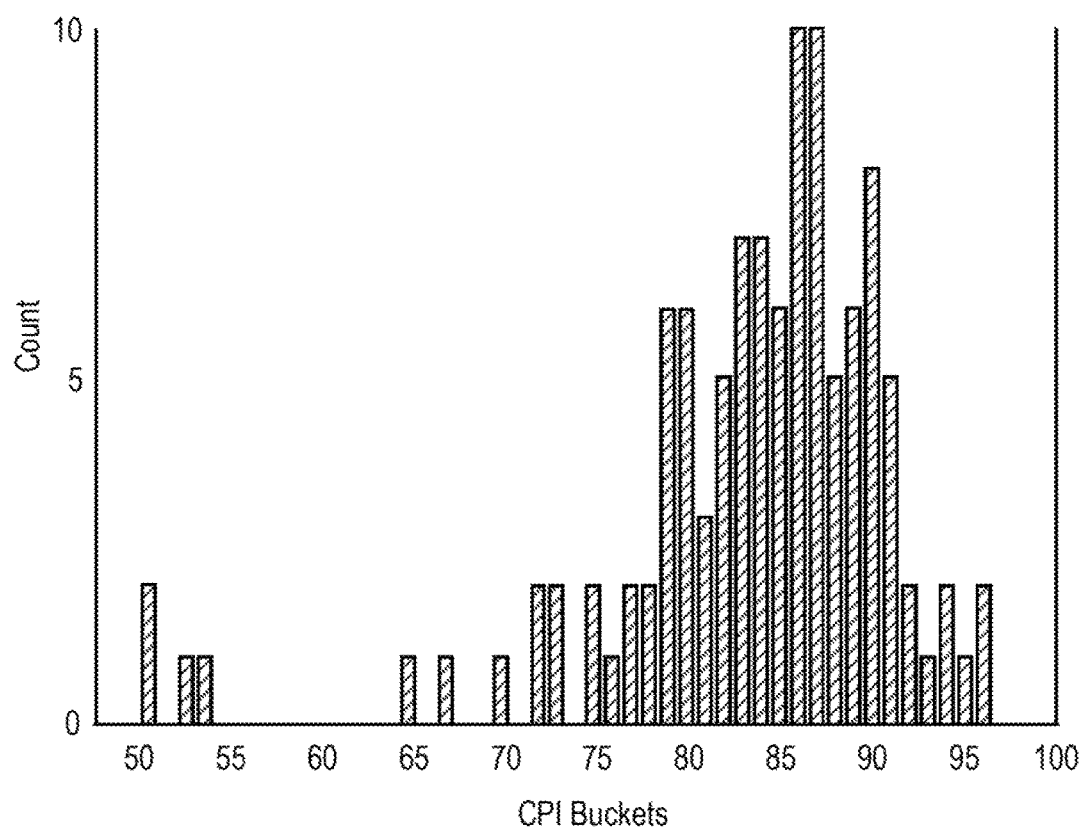
FIG. 6 illustrates an example distribution of CPI scores for a plurality of mPulse tenants.

FIG. 6 illustrates an example distribution of CPI scores for a large plurality of mPulse tenants that provide a huge sample of sessions with performance data, and for which an exact CPI score can be calculated according the systems and methods described herein.

It should be understood that elements of the disclosed subject matter may also be provided as a computer program product which may include a machine-readable medium having stored thereon instructions which may be used to program a computer (e.g., a processor or other electronic device) to perform a sequence of operations, such as those described above. Alternatively, the operations may be performed by a combination of hardware, firmware, and software. The machine-readable medium may include, but is not limited to, floppy diskettes, optical disks, CD-ROMs, and magneto-optical disks, ROMs, RAMs, EPROMs, EEPROMs, magnet or optical cards, or other type of machine-readable medium suitable for storing electronic instructions.

Additionally, although the present invention has been described in conjunction with specific embodiments, numerous modifications and alterations are well within the scope of the present invention. Accordingly, the specification and drawings are to be regarded in an illustrative rather than a restrictive sense.

We claim:

1. A computer-implemented method for creating a benchmark for consumer satisfaction of website or web application performance, comprising:
    aggregating, for each of a plurality of tenants of a data analysis system, real user measurement (RUM) data captured from devices of users during sessions on a website or web application, the RUM data including a landing page load time of each user and whether a bounce occurred;
    modeling for each tenant a probability, y (x), that a user of the website or web application will bounce, given the landing page load time x, where y (x) has a range from 0 to 1;
    calculating, for each tenant, an ordered discrete set of lethal dose (LD) values using a lethal dose function LD(p), which is an estimated average landing page load time given a bounce rate of p, a median Lethal Dose function being defined as LD50=LD(0.5);
    determining tenant erroneousness by applying one or more different filters to each tenant, resulting in a set of non-erroneous tenants;
    calculating a mean of each LD value in the ordered discrete set of LD values across all of the non-erroneous tenants, resulting in an ordered set of mean LD values;
    reducing the set of ordered set of mean LD values to exactly $10^m$ ordered mean LD values, where m is an integer; and
    mapping the $10^m$ ordered mean LD values to a corresponding number of ordered CPI scores ranging from 0 to 100, wherein the mapping results in the benchmark.

2. The computer-implemented method of claim 1 wherein the modeling is performed using the RUM data and a logistic regression model.

3. The computer-implemented method of claim 2 wherein the probability that a user of the website or web application will bounce is given as:

$$y(x) = \frac{1}{1 + e^{-(\beta_0 + \beta_1 x)}}$$

where $\beta_0$ is an intercept coefficient, and $\beta_1$ is a slope coefficient, of the logistic regression model.

4. The computer-implemented method of claim 3 wherein $\beta_0$ and $\beta_1$ are estimated using a Maximum Likelihood Estimation (MLE) method.

5. The computer-implemented method of claim 3 wherein the lethal dose function LD(p) is given as:

$$LD(p) = \frac{\ln((1/p) - 1) + \beta_0}{\beta_1}$$

where ln is the natural logarithm.

6. The computer-implemented method of claim 1 wherein the ordered discrete set of LD values is calculated at different resolutions for different ranges of the LD values.

7. The computer-implemented method of claim 1 further comprising limiting the ordered discrete set of LD values to a specific range.

8. The computer-implemented method of claim 7 wherein the specific range is LD15 to LD85.

9. The computer-implemented method of claim 1 further comprising reducing the ordered discrete set of LD values to a smaller set of ordered values.

10. The computer-implemented method of claim 9 wherein the smaller set of ordered values comprises exactly 1,000 values.

11. The computer-implemented method of claim 1 wherein the determining step comprises determining a statistical significance of each model using test statistic.

12. The computer-implemented method of claim 11 wherein the test statistic comprises a Wald test statistic.

13. The computer-implemented method of claim 12 wherein the determining step comprises flagging a tenant as erroneous if LD85<LD15.

14. The computer-implemented method of claim 1 wherein the reducing step comprises:
    identifying a smallest non-negative mean LD value from the ordered set of mean LD values;
    denoting the smallest non-negative mean LD value, mean $LD_{min}$, as a first element in the reduced set of $10^m$ ordered mean LD values;
    starting with mean $LD_{min}$, taking the next ($10^m-1$) mean LD values from the ordered set of mean LD values in ascending sequence, with the $10^m$ ordered mean LD value being denoted $LD_{max}$.

15. The computer-implemented method of claim 14 further comprising assigning a CPI score to another website or web application outside of the reduced set of $10^m$ ordered mean LD values by applying a set of rules to a load time, l, of the another website or web application.

16. The computer-implemented method of claim 15 wherein the set of rules comprises:
    if the load time l is greater than or equal to $LD_{max}$, then the CPI score is 0.0;
    if load time l is less than or equal to $LD_{min}$, then the CPI score is 100.0; and
    where $LD_{min}<l<LD_{max}$, and $l>(n-1)^{th}$ LD value AND $l\leq n^{th}$ LD value ($1<n<10^m$), then the CPI score is equal to the $n^{th}$ value from the corresponding number of ordered CPI scores.

17. The computer-implemented method of claim 1 wherein m is 3.

* * * * *